United States Patent
Oji (10) Patent No.: US 7,683,432 B2
(45) Date of Patent: Mar. 23, 2010

(54) SEMICONDUCTOR DEVICE HAVING HIGH-K GATE DIELECTRIC LAYER AND METHOD FOR MANUFACTURING THE SAME

(75) Inventor: Hiroshi Oji, Shizuoka (JP)

(73) Assignee: Rohm Co., Ltd., Kyoto (JP)

( * ) Notice: Subject to any disclaimer, the term of this patent is extended or adjusted under 35 U.S.C. 154(b) by 702 days.

(21) Appl. No.: 10/572,730

(22) PCT Filed: Jun. 20, 2005

(86) PCT No.: PCT/JP2005/011260

§ 371 (c)(1),
(2), (4) Date: Mar. 21, 2006

(87) PCT Pub. No.: WO2006/001249

PCT Pub. Date: Jan. 5, 2006

(65) Prior Publication Data

US 2008/0230842 A1    Sep. 25, 2008

(30) Foreign Application Priority Data

Jun. 25, 2004    (JP)    ............................. 2004-187240

(51) Int. Cl.
*H01L 21/8238*    (2006.01)
(52) U.S. Cl. ..................... 257/369; 257/368; 257/371; 257/410; 257/411; 257/E27.061; 257/E27.062; 257/E27.064
(58) Field of Classification Search ................. 257/368, 257/369, 371, 410, 411, E27.061, E27.062, 257/E27.064
See application file for complete search history.

(56) References Cited

U.S. PATENT DOCUMENTS 5,362,981 A    11/1994    Sato et al.
5,589,410 A    12/1996    Sato et al.

(Continued)

FOREIGN PATENT DOCUMENTS

JP    2-28971    1/1990

(Continued)

OTHER PUBLICATIONS

Zhu et al.; "HfO$_2$ and HfAlO for CMOS: Thermal Stability and Current Transport"; IEDM 2001; pp. 463-466.

(Continued)

*Primary Examiner*—Andy Huynh
(74) *Attorney, Agent, or Firm*—Keating & Bennett, LLP (57)    ABSTRACT

A semiconductor device having a high-K gate dielectric layer includes a p-type well that is formed in an upper layer of a silicon substrate. Arsenic ions are implanted into an extreme surface layer of the p-type well and a heat treatment is performed to form a p-type low-concentration layer. A HfAlOx film and a polycrystalline silicon layer are laminated on the substrate. A gate electrode is formed by patterning the polycrystalline silicon layer. After a n-type extension region is formed by implanting arsenic ions by using the gate electrode as a mask, sidewall spacers are formed on sides of the gate electrode. Arsenic ions are implanted by using the sidewall spacers and the gate electrode as masks, whereby n-type source/drain regions are formed.

4 Claims, 7 Drawing Sheets

U.S. PATENT DOCUMENTS

| | | | |
|---|---|---|---|
| 6,849,908 B2 * | 2/2005 | Hirano et al. | 257/410 |
| 6,872,613 B1 * | 3/2005 | Xiang et al. | 438/199 |
| 7,087,969 B2 * | 8/2006 | Nishiyama et al. | 257/369 |
| 2002/0006693 A1 | 1/2002 | Matsuda | |

FOREIGN PATENT DOCUMENTS

| | | |
|---|---|---|
| JP | 3-276730 | 12/1991 |
| JP | 5-183159 | 7/1993 |
| JP | 9-191108 | 7/1997 |
| JP | 2000-353756 | 12/2000 |
| JP | 2002-313950 | 10/2002 |

OTHER PUBLICATIONS

International Search Report for PCT Application No. PCT/2005/11260, mailed Sep. 27, 2005.

Official communication issued in the corresponding International Application No. PCT/JP2005/011260, mailed on Jan. 11, 2007.

* cited by examiner

SEMICONDUCTOR DEVICE HAVING HIGH-K GATE DIELECTRIC LAYER AND METHOD FOR MANUFACTURING THE SAME

FIELD OF THE INVENTION

The present invention relates to a semiconductor device having a high-k gate dielectric layer and a method for manufacturing the semiconductor device. More particularly, the present invention relates to the control of the threshold voltage of a MISFET.

DESCRIPTION OF THE BACKGROUND ART

In order to realize a high-speed performance and size reduction of semiconductor devices, such as a MISFET (metal insulator semiconductor field effect transistor), a thin gate dielectric layer has been adopted. However, a problem that gate leakage current increases when the thickness of a silicon oxide film and a silicon oxynitride film (hereinafter referred to as "a silicon oxide film and the like") is reduced. The silicon oxide film and the like have been used as gate dielectric layers. To solve this problem, there has been proposed a technique which involves adopting a film having high dielectric constant (k) (hereinafter referred to as "a high-k gate dielectric layer") as a gate dielectric layer.

Also, there has been proposed a technique which involves controlling the threshold voltage of a MOS (metal oxide semiconductor) transistor by forming P-type impurity regions (refer to, for example, Japanese Patent Laid-Open No. 2002-313950).

However, as a result of an examination by the present inventor, it became apparent that the use of a high-k gate dielectric layer as a gate dielectric layer of a MISFET causes the problem that the threshold voltage of a MISFET rises more than when a silicon oxide film and the like are used. As one cause, it might be that this is because the metals contained in a high-k gate dielectric layer and the Si contained in a gate electrode react with each other. Furthermore, as another cause it might be that this is because the metals contained in a high-k gate dielectric layer react with arsenic ions and boron ions implanted into a substrate for use in the formation of source/drain regions.

Since the driving performance of a transistor decreases if the threshold voltage of a MISFET rises, it is necessary to control the threshold voltage with high accuracy.

SUMMARY OF THE INVENTION

The present invention has been conceived to solve the problems described above and preferred embodiments of the present invention provide a novel and useful semiconductor device and method for manufacturing the same, so as to control a threshold voltage of the semiconductor device having a high-k gate dielectric layer with high accuracy.

According to first aspect of the present invention, the semiconductor device according to a preferred embodiment includes a well of a first conductive type formed in an upper layer of a substrate. A low-concentration layer of the first conductive type having a lower impurity concentration than the well is formed in an extreme surface layer of a channel portion of the well. A high-k gate dielectric layer having a higher dielectric constant than a silicon oxide film is formed on the low-concentration layer. A gate electrode is formed on the high-k gate dielectric layer. Source/drain regions of a second conductive type are formed in an upper layer of the well, the source/drain regions sandwiching the low-concentration layer.

According to second aspect of the present invention, the complementary semiconductor device having a n-type circuit region and a p-type circuit region, includes a p-type well formed in an upper layer of a substrate of the n-type circuit region. A n-type well is formed in an upper layer of the substrate of the p-type circuit region. A p-type low-concentration layer is formed in an extreme surface layer of a channel portion of the p-type well, the p-type low-concentration layer having a lower impurity concentration than the p-type well. An n-type low-concentration layer is formed in an extreme surface layer of a channel portion of the n-type well, the n-type low-concentration having a lower impurity concentration than the n-type well. A high-k gate dielectric layer is formed on the p-type and n-type low-concentration layers, the high-k gate dielectric layer having a higher dielectric constant than a silicon oxide film. A gate electrode is formed on the high-k gate dielectric layer. N-type source/drain regions are formed in an upper layer of the p-type well, the n-type source/drain regions sandwiching the p-type low-concentration layer. P-type source/drain regions are formed in an upper layer of the n-type well, the p-type source/drain regions sandwiching the n-type low-concentration layer.

According to third aspect of the present invention, in the method for manufacturing a semiconductor device according to another preferred embodiment of the present invention, a well is firstly formed by implanting a first conductive type impurity into a substrate. A second conductive type impurity is implanted into an extreme surface layer of a channel portion of the well. A high-k gate dielectric layer having a higher dielectric constant than a silicon oxide film is formed on the substrate, after implanting the second conductive type impurity. A gate electrode material film to be a gate electrode is formed on the high-k gate dielectric layer. A gate electrode is formed by patterning the gate electrode material film and the high-k gate dielectric layer. Source/drain regions are formed by implanting a second conductive type impurity into the substrate by using the gate electrode as a mask.

According to fourth aspect of the present invention, in the method for manufacturing a complementary semiconductor device, a p-type well is formed in an upper layer of a substrate of the n-type circuit region. An n-type well is formed in the upper layer of the substrate of the p-type circuit region. N-type impurities are implanted into an extreme surface layer of a channel portion of the p-type well. P-type impurities are implanted into an extreme surface layer of a channel portion of the n-type well. A high-k gate dielectric layer having a higher dielectric constant than a silicon oxide film is formed on the substrate, after implanting the n-type and p-type impurities. A gate electrode material film to be a gate electrode is formed on the high-k gate dielectric layer. A gate electrode is formed by patterning the gate electrode material film and the high-k gate dielectric layer in the n-type and p-type circuit regions. N-type source/drain regions are formed by implanting the n-type impurity into the p-type well by using the gate electrode as a mask. P-type source/drain regions are formed in the p-type circuit region by implanting the p-type impurity into the n-type well by using the gate electrode as a mask.

According to fifth aspect of the present invention, in the method for manufacturing a complementary semiconductor device, a p-type well is firstly formed by implanting boron ions with a dosage of $1 \times 10^{13}$ atoms/cm$^2$ into an upper layer of a substrate in the n-type circuit region. An n-type well is formed by implanting phosphorus ions with a dosage of $1 \times 10^{13}$ atoms/cm$^2$ into an upper layer of the substrate in the p-type circuit region. Arsenic or phosphorus ions are implanted with a dosage of 5 to $8\times10^{12}$ atoms/cm$^2$ into an extreme surface layer of a channel portion of the p-type well. Boron ions are implanted with a dosage of 3 to $5\times10^{12}$ atoms/cm$^2$ into an extreme surface layer of a channel portion of the n-type well. P-type and n-type low-concentration layers are formed on an extreme surface layer of a channel portion of the p-type and n-type wells by diffusing the arsenic or phosphorus and boron ions implanted into the extreme surface layer by performing a heat treatment. A HfAlOx film is formed on the substrate, after performing the heat treatment. A polycrystalline silicon film to be a gate electrode is formed on the HfAlOx film. A gate electrode is formed on the p-type and n-type low-concentration layers via the HfAlOx film by patterning the polycrystalline silicon film and HfAlOx film. N-type source/drain regions are formed by implanting n-type impurities into the p-type well by using the gate electrode as a mask. P-type source/drain regions are formed in the p-type circuit region by implanting p-type impurities into the n-type well by using the gate electrode as a mask.

Other features, elements, steps, advantages and characteristics of the present invention will be apparent from the following detailed description of preferred embodiments of the present invention when read in conjunction with the accompanying drawings.

BRIEF DESCRIPTION OF THE DRAWINGS

FIGS. 4A to 6C are sectional process views for describing a method for manufacturing a semiconductor device according to the second preferred embodiment of the present invention;

DETAILED DESCRIPTION OF PREFERRED EMBODIMENTS

In the following, principles and preferred embodiments of the present invention will be described with reference to the accompanying drawings. The members and steps that are common to some of the drawings are given the same reference numerals and redundant descriptions therefore may be omitted.

First Preferred Embodiment

Figure 1:
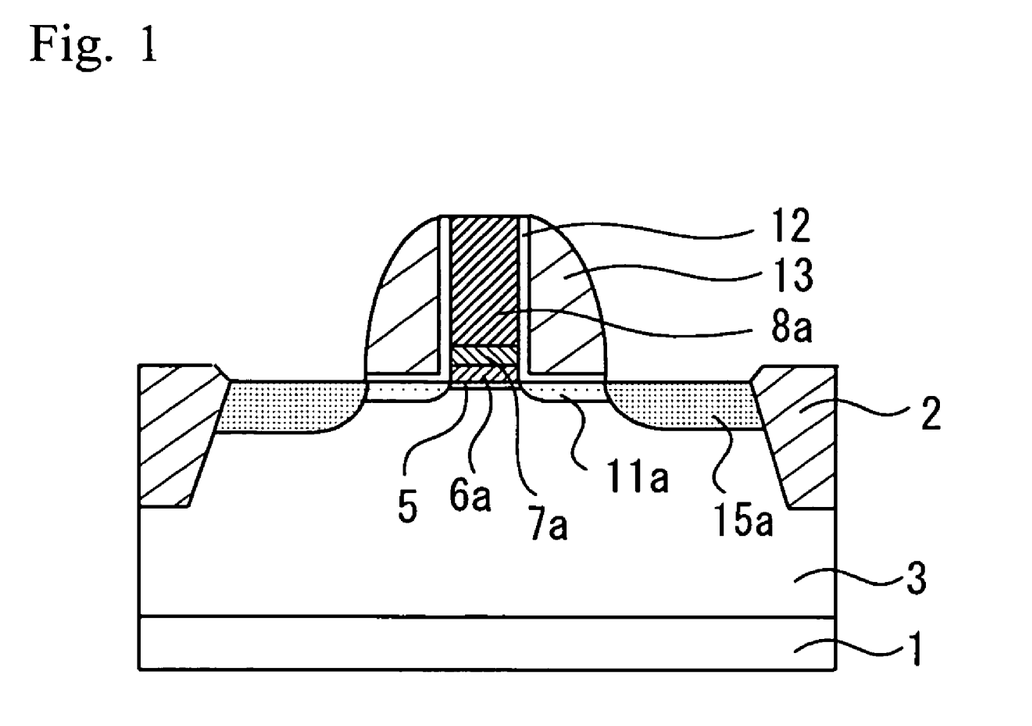
FIG. 1 is a sectional view for describing a semiconductor device according to a first preferred embodiment of the present invention.

FIG. 1 is a sectional view for describing a semiconductor device according to a first preferred embodiment of the present invention. More specifically, FIG. 1 is a sectional view for describing an n-type channel MISFET (hereinafter referred to "NMISFET").

As shown in FIG. 1, element isolation structures 2 for isolating active regions of a silicon substrate 1 are formed. A p-type well (hereinafter referred to "p-well") 3 is formed in an upper layer of the silicon substrate 1. A p-type low-concentration layer 5 is formed on an extreme surface layer of a channel portion of the p-well 3. Although a detailed description will be given later, this p-type low-concentration layer 5 is preferably formed using the counter-doping of n-type impurities. The p-type low-concentration layer 5 has a lower impurity concentration than the p-well 3 around this layer 5. By forming the p-type low-concentration layer 5 in the extreme surface layer of the channel portion, it is possible to perform the control of the threshold voltage of a MISFET with high accuracy (which will be described later). The depth of the p-type low-concentration layer 5 is several nanometers to 10 nm or the like from the surface of the silicon substrate 1. At positions deeper than this level, the p-type low-concentration layer is offset by the p-well 3. A silicon oxide film 6a is formed on the p-type low-concentration layer 5. On the silicon oxide film 6a, a HfAlOx film is formed as a high-k gate dielectric layer 7a. The HfAlOx film 7a has a higher dielectric constant than the silicon oxide film 6a.

A gate electrode 8a made from a polycrystalline silicon film is formed on the HfAlOx film 7a. Sidewall spacers 13 made from a silicon nitride film are formed on sides of the gate electrode 8a through a silicon oxide film 12. The silicon oxide film 12 is served for damage prevention. In the upper layer of the p-well 3 under the sidewall spacers 13, n-type extension regions 11a are formed in such a manner as to sandwich a p-type low-concentration layer 5a. In addition, n-type source/drain regions 15a connected to the n-type extension regions 11a are formed in the upper layer of the p-well 3.

Next, a method for manufacturing the above-described semiconductor device will be described.

FIGS. 2A to 2F are sectional process views for describing a method for manufacturing a semiconductor device according to the first preferred embodiment of the present invention. More specifically, FIGS. 2A to 2F are sectional process view for describing a method for manufacturing a NMISFET.

Figure 2A:
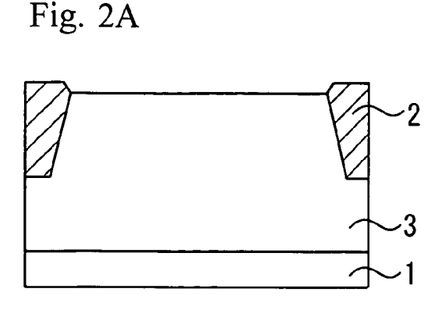
FIGS. 2A to 2F are sectional process views for describing a method for manufacturing a semiconductor device according to the first preferred embodiment of the present invention.

First, as shown in FIG. 2A, element isolation structures 2 each made from a silicon oxide film are formed in a p-type silicon substrate 1 by a STI (shallow trench isolation) process. Boron ions as p-type impurities are implanted into active regions isolated by the element isolation structures 2 with a dosage of, for example, $1\times10^{13}$ atoms/cm$^2$ and with an acceleration voltage of 130 keV. Thereafter, a heat treatment is performed to form a p-well 3.

Figure 2B:
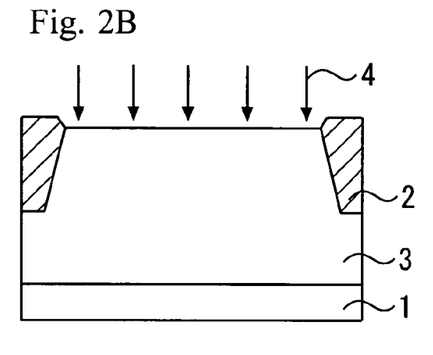
Figure 2C:
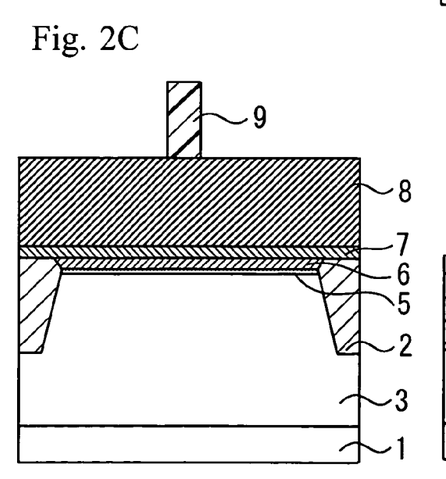

Next, as shown in FIG. 2B, arsenic ions as n-type impurities 4 are implanted into an extreme surface layer of the p-well 3, i.e., an extreme surface layer of a portion to be a channel region of the p-well 3 (hereinafter referred to as a "channel portion") with a dosage of, for example, 5 to $8\times10^{12}$ atoms/cm$^2$ and with an acceleration voltage of 80 keV. Thereafter, a heat treatment is performed with a temperature of 850° C. for 30 seconds or so. Thus, the arsenic ions are diffused. As shown in FIG. 2C, a p-type low-concentration layer 5 having a lower impurity concentration than the p-well 3 is formed in the extreme surface layer of the p-well 3. Although a detailed description will be given later, this p-type low-concentration layer 5a makes it possible to control the threshold voltage of the MISFET having a high-k gate dielectric layer 7 with high accuracy.

Next, as shown in FIG. 2C, a silicon oxide film 6 is formed using a thermal oxidation process on the p-type low-concentration layer 5 in a film thickness of, for example, 0.7 nm to 1.0 nm. On the silicon oxide film 6, an HfAlOx film as a high-k gate dielectric layer 7 having a higher dielectric constant than the silicon oxide film 6 is formed in a film thickness of, for example, 1.2 nm to 2.5 nm. Furthermore, a polycrystalline silicon film 8 to be a gate electrode is formed on the HfAlOx film 7 using silane gas as a material in a film thickness of, for example, 125 nm or so. Although not shown, phosphorus ions as gate dopants are implanted into the polycrystalline silicon film 8 with a dosage of, for example, $1 \times 10^{16}$ atoms/cm$^2$. Thereafter, the gate dopant implanted in the polycrystalline silicon film 8 is diffused by performing heat treatment. Furthermore, a resist pattern 9 is formed by a lithography technique on the polycrystalline silicon film 8.

Figure 2D:
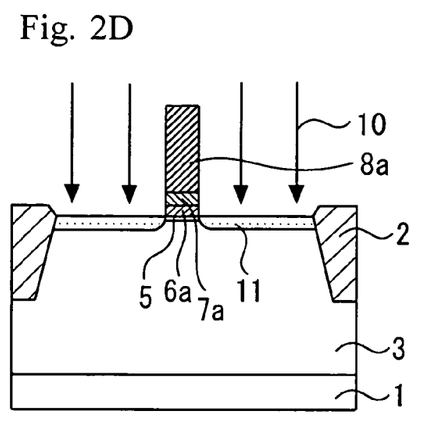
Figure 2E:
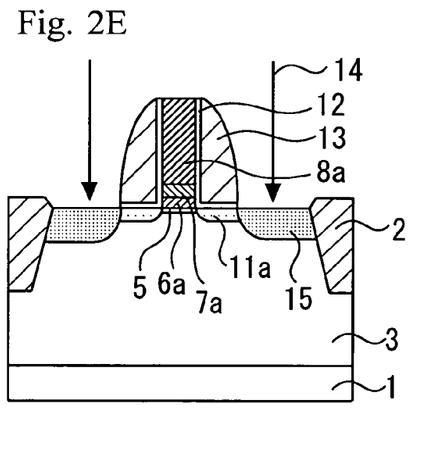

Subsequently, the polycrystalline silicon film 8, the HfAlOx film 7 and the silicon oxide film 6 are etched in this order by using the resist pattern 9 as a mask. Thereafter, the resist pattern 9 is removed. Thus, as shown in FIG. 2D, a gate electrode 8a is formed on the p-type low-concentration layer 5 of the silicon substrate 1 through gate dielectric layers 6a, 7a. That is, the p-type low-concentration layer 5 is positioned in an extreme surface layer of a channel region immediately under the gate dielectric layer 6a. Next, arsenic ions 10 as n-type impurities are implanted with an acceleration voltage of 2 keV and with a dosage of, for example, $1 \times 10^{15}$ atoms/cm$^2$ using the gate electrode 8a as a mask, whereby n-type impurity layers 11 are formed. Thereafter, a heat treatment is performed. Thus, the arsenic ions in the n-type impurity layers 11 are activated and, as shown in FIG. 2E, n-type extension regions 11a are formed in the silicon substrate 1.

Figure 2F:
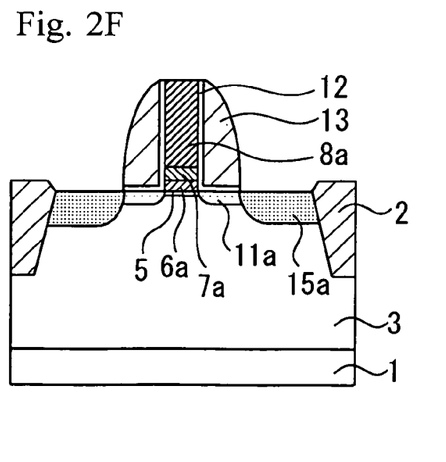

Next, a silicon oxide film 12 for damage prevention is formed on an entire surface of the substrate 1 in a film thickness of, for example, 2 nm. A silicon nitride film 13 is formed on the silicon oxide film 12 in a film thickness of, for example, 50 nm to 80 nm. Subsequently, the silicon nitride film 13 and the silicon oxide film 12 are anisotropically etched. Thus, as shown in FIG. 2E, sidewall spacers 13 covering sides of the gate electrode 8a are formed in a self-aligning manner. Next, arsenic ions 14 as n-type impurities are implanted, for example, with an acceleration voltage of 35 keV and with a dosage of $5 \times 10^{15}$ atoms/cm$^2$ using the sidewall spacers 13 and the gate electrode 8a as masks, whereby n-type impurity layers 15 are formed. Thereafter, a heat treatment is performed. Thus, the arsenic ions in the n-type impurity layer 15 are activated and, as shown in FIG. 2F, n-type source/drain regions 15a having a higher concentration than the n-type extension region 11 are formed in the silicon substrate 1.

As described above, in this first preferred embodiment, after the formation of the p-well 3, the arsenic ions 4 are implanted into the extreme surface layer of the channel portion of the p-well 3. Thereafter, a heat treatment is performed. Thus, the p-type low-concentration layer 5 having a lower impurity concentration than the p-well 3 is formed in the extreme surface layer of p-well 3. As a result, even in a case where an HfAlOx film containing metals is used as a gate dielectric layer, it is possible to control the threshold voltage of a MISFET. Therefore, the threshold voltage of a semiconductor having a high-k gate dielectric layer can be controlled with high accuracy.

Incidentally, in this first preferred embodiment, the description has been given of a n-type channel MISFET. However, the present invention can also be applied to a p-type channel MISFET. In this case, an n-type well (hereinafter referred to "n-well") is formed by implanting phosphorus ions with a dosage of $1 \times 10^{13}$ atoms/cm$^2$ and with an acceleration voltage of 300 keV after the formation of the element isolation structures 2 and by performing heat treatment. Thereafter, boron ions as p-type impurities are implanted into the extreme surface layer of the channel portion of the n-type well with a dosage of, for example, 3 to $5 \times 10^{12}$ atoms/cm$^2$ and with an acceleration voltage of 15 keV, and a heat treatment is performed. Thus, a p-type low-concentration layer is formed. Then, a MISFET is formed by the same technique as for a PMIS region of the second preferred embodiment, which will be described below.

Also, in this first preferred embodiment, the description has been given of a MISFET having a LDD (lightly doped drain) structure. However, the preset invention can also be applied to a MISFET having no LDD structure. The same thing applies also to the second preferred embodiment, which will be described later. In this case, n-type impurities for forming n-type source/drain regions is implanted into the silicon substrate 1 by using the gate electrode 8a as a mask after the patterning of the gate electrode.

Also, it is possible to use a silicon nitride film or a silicon oxynitride film in place of the silicon oxide film 6. Furthermore, it is possible to use a hafnium oxide film (HfO$_2$ film, hafnia film), a Hf silicate film (HfSiOx film) or an aluminum oxide film (Al$_2$O$_3$ film, alumina film) or films obtained by nitriding these films as the high-k gate dielectric layer 7 in addition to the HfAlOx film (Hf aluminate film). Also, the high-k gate dielectric layer 7 may be formed directly on the silicon substrate 1 without the formation of the silicon oxide film 6 (the same thing applies also to the second embodiment, which will be described later).

Furthermore, it is possible to use a polycrystalline silicon germanium film in place of a polycrystalline silicon film as the gate electrode material film 8 (the same thing applies also to the second preferred embodiment, which will be described later).

Also, in order to form the p-type low-concentration layer 5, it is possible to implant phosphorus ions in place of the arsenic ions 4 with a dosage of, for example, 5 to $8 \times 10^{12}$ atoms/cm$^2$ and with an acceleration voltage of 35 keV (the same thing applies also to the second embodiment, which will be described later). Also in this case, a p-type low-concentration layer of the same depth can be obtained.

Second Preferred Embodiment

Figure 3:
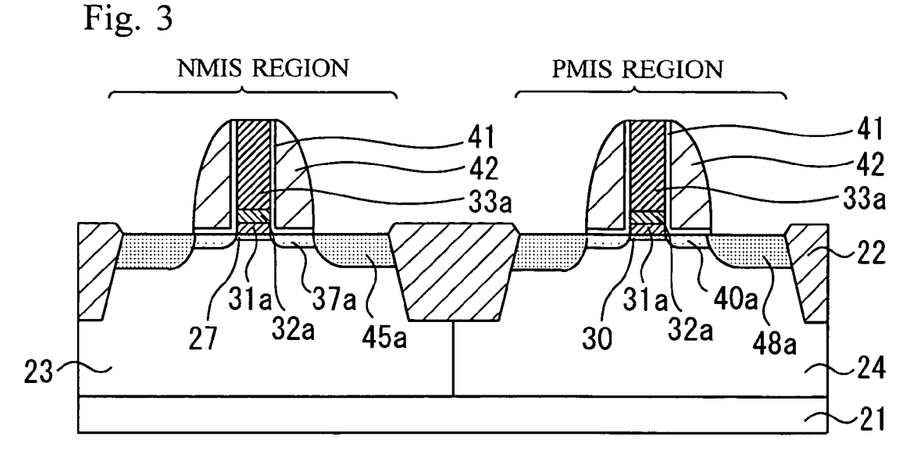
FIG. 3 is a sectional view for describing a semiconductor device according to a second preferred embodiment of the present invention.

FIG. 3 is a sectional view for describing a semiconductor device according to a second preferred embodiment of the present invention. Concretely, FIG. 3 is a sectional view for describing a CMISFET (complementary MISFET) serving as a complementary semiconductor device.

As shown in FIG. 3, element isolation structures 22 for isolating active regions of a silicon substrate 21 are formed. A NMIS region and a PMIS region are defined by the element isolation structures 22. A p-well 23 is formed in an upper layer of the silicon substrate 21 of the NMIS region. An n-well 24 is formed in an upper layer of the silicon substrate 21 of the PMIS region. A p-type low-concentration layer 27 is formed in an extreme surface layer of a channel portion of the p-well 23. An n-type low-concentration layer 30 is formed in an extreme surface layer of a channel portion of the n-well 24. Although a detailed description will be given later, the p-type low-concentration layer 27 and the n-type low-concentration layer 30 are formed by counter-doping n-type impurities and p-type impurities. The p-type and n-type low-concentration layers 27, 30 have lower impurity concentrations than the p-well 23 and n-well 24 around the layers 27, 30. By forming the p-type low-concentration layer 27 and the n-type low-concentration layer 30 in the extreme surface layer of the channel portion, it is possible to perform the control of the threshold voltage of an n-type channel MISFET and a p-type channel MISFET with high accuracy (which will be described later). The depth of the p-type low-concentration layer 27 and the n-type low-concentration layer 30 is several nanometers to 10 nm or the like from the surface of the silicon substrate 21. At positions deeper than this level, the p-type low-concentration layer 27 and the n-type low-concentration layer 30 are offset by the p-well 23 and the n-well 24. A silicon oxide film 31a is formed on each of the p-type low-concentration layer 27 and the n-type low-concentration layer 30. On the silicon oxide film 31a, a HfAlOx film is formed as a high-k gate dielectric layer 32a. The HfAlOx film 32a has a higher dielectric constant than the silicon oxide film 31a.

A gate electrode 33a made from a polycrystalline silicon film is formed on the HfAlOx film 32a. Sidewall spacers 42 made from a silicon nitride film are formed on sides of the gate electrode 33a through a silicon oxide film 41. The silicon oxide film 41 is provided for damage prevention.

In the upper layer of the p-well 23 under the sidewall spacers 42 in the NMIS region, n-type extension regions 37a are formed so as to sandwich the p-type low-concentration layer 27. In addition, n-type source/drain regions 45a connected to the n-type extension regions 37a are formed in the upper layer of the p-well 23.

Also, in the upper layer of the n-well 24 under the sidewall spacers 42 in the PMIS region, p-type extension regions 40a are formed so as to sandwich the n-type low-concentration layer 30. In addition, p-type source/drain regions 48a connected to the n-type extension regions 40a are formed in the upper layer of the n-well 24.

Next, a method for manufacturing the above-described semiconductor device will be described.

FIGS. 4A to 6C are sectional process views for describing a method for manufacturing a semiconductor device according to the second preferred embodiment of the present invention. More specifically, these figures are sectional process views for describing a method for manufacturing a CMISFET serving as a complementary semiconductor device.

Figure 4A:
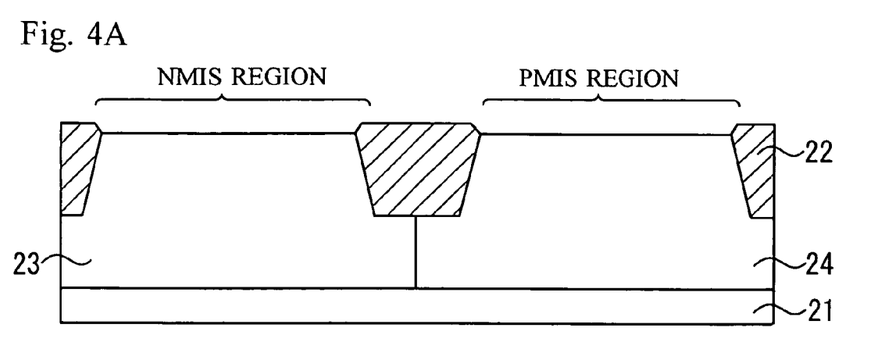

First, as shown in FIG. 4A, element isolation structures 22 are formed in a p-type silicon substrate 21 by the STI process. Next, boron ions as p-type impurities are implanted into active regions of a n-type channel MISFET region (hereinafter referred to as "NMIS region") isolated by the element isolation structures 22 with a dosage of, for example, $1\times10^{13}$ atoms/cm$^2$ and with an acceleration voltage of 130 keV. Thereafter, a heat treatment is performed to diffuse the boron ions. Thus, a p-well 23 is formed.

Also, phosphorus ions as n-type impurities are implanted into active regions of a p-type channel MISFET region (hereinafter referred to as "PMIS region") with a dosage of, for example, $1\times10^{13}$ atoms/cm$^2$ and with an acceleration voltage of 300 keV. Thereafter, a heat treatment is performed to diffuse the phosphorus ions. Thus, the n-well 24 is formed. Incidentally, the p-type impurities and the n-type impurities can be diffused by performing heat treatment once.

Figure 4B:
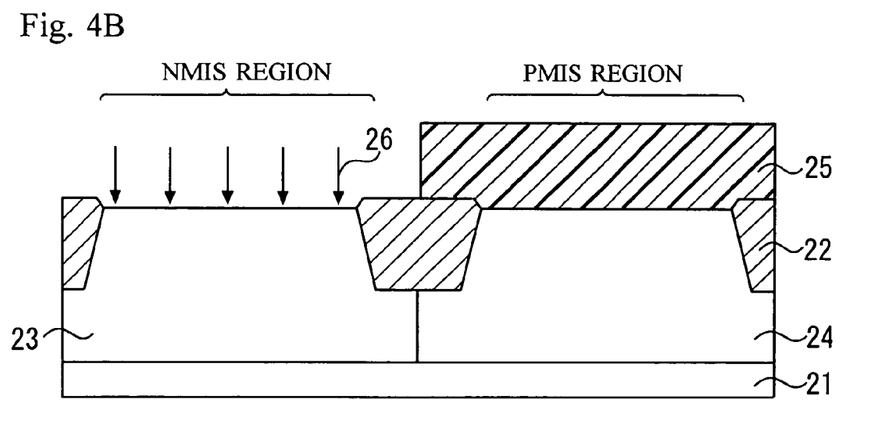

Next, as shown in FIG. 4B, a resist pattern 25 covering the PMIS region is formed using a lithography technique. Arsenic ions as n-type impurities 26 are implanted into an extreme surface layer of the p-well 23, i.e., an extreme surface layer of a channel portion of the p-well 23 with a dosage of, for example, 5 to $8\times10^{12}$ atoms/cm$^2$ and with an acceleration voltage of 80 keV. Thereafter, the resist pattern 25 is removed.

Figure 4C:
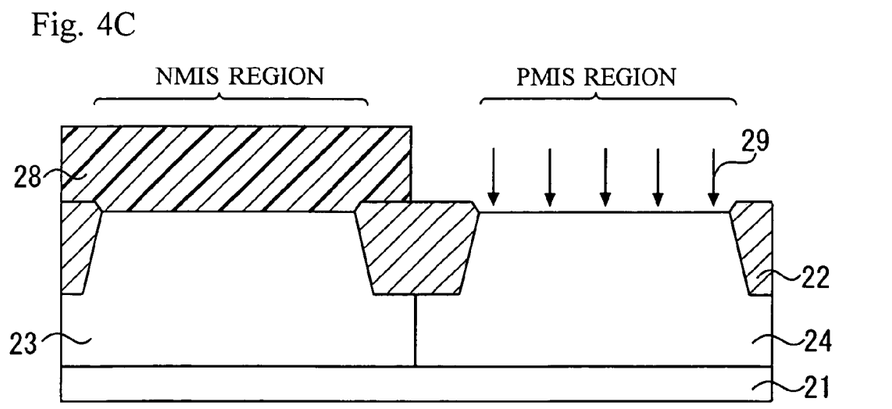

Next, as shown in FIG. 4C, a resist pattern 28 covering the NMIS region is formed using a lithography technique. Boron ions as p-type impurities 29 are implanted into an extreme surface layer of the n-well 24, i.e., an extreme surface layer of a channel portion of the n-well 24 with a dosage of, for example, 3 to $5\times10^{12}$ atoms/cm$^2$ and with an acceleration voltage of 15 keV. The resist pattern 28 is removed.

Thereafter, a heat treatment is performed with a temperature of 850° C. for about 30 seconds or so. Thus, as shown in FIG. 5A, p-type low-concentration layers 27 are formed in the extreme surface layer of the p-well 23, and n-type low-concentration layers 30 are formed in the extreme surface layer of the n-well 24.

Figure 5A:
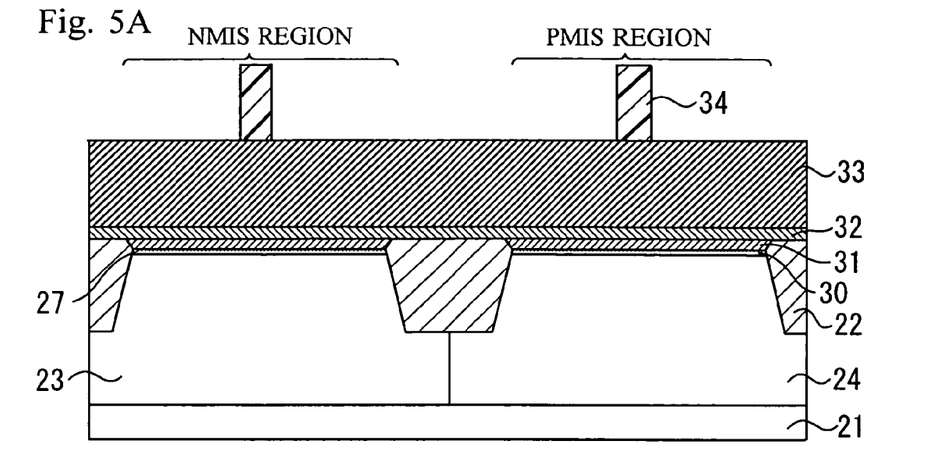

Next, as shown in FIG. 5A, a silicon oxide film 31 is formed using the thermal oxidation process on the silicon substrate 21 in a film thickness of, for example, 0.7 nm to 1.0 nm. On the silicon oxide film 31, an HfAlOx film is formed as a high-k gate dielectric layer 32 in a film thickness of, for example, 1.2 nm to 2.5 nm. The HfAlOx film 32 has a higher dielectric constant than the silicon oxide film 31. Furthermore, a polycrystalline silicon film 33 to be a gate electrode is formed on the HfAlOx film 32 using silane gas as a material in a film thickness of, for example, 125 nm or so.

Although not shown, the PMIS region is masked with a resist pattern, and phosphorus ions as gate dopants are implanted into the polycrystalline silicon film 33 of the NMIS region with a dosage of, for example, $1\times10^{16}$ atoms/cm$^2$. By using a similar technique, the NMIS region is masked with a resist pattern, and boron ions as gate dopants are implanted into the polycrystalline silicon film 33 of the PMIS region with a dosage of, for example, $3\times10^{15}$ atoms/cm$^2$. The gate dopants implanted in the polycrystalline silicon film 33 are diffused by performing a heat treatment.

Next, a resist pattern 34 is formed on the polycrystalline silicon film 33 using the lithography technique.

The polycrystalline silicon film 33, the HfAlOx film 32 and the silicon oxide film 31 are etched in this order using the resist pattern 34 as a mask. Next, the resist pattern 34 is removed. Thus, as shown in FIG. 5B, a gate electrode 33a is formed on the n-type low-concentration layer 27 of the NMIS region through gate dielectric layers 31a, 32a, and a gate electrode 33a is formed on the p-type low-concentration layer 30 of the PMIS region through gate dielectric layers 25a, 26a.

Figure 5B:
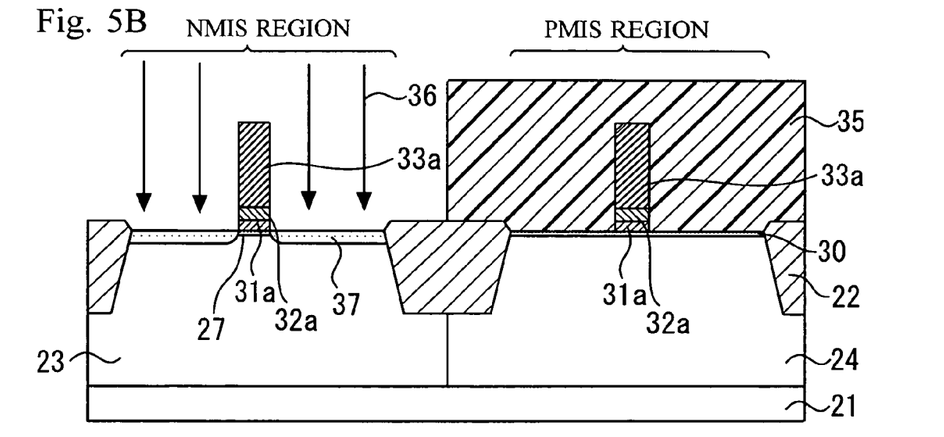

Next, as shown in FIG. 5B, a resist pattern 35 covering the PMIS region is formed using a lithography technique. Arsenic ions 36 as n-type impurities for forming n-type extension regions are implanted with an acceleration voltage of 2 keV and with a dosage of, for example, $1\times10^{15}$ atoms/cm$^2$ using the gate electrode 33a of the NMIS region as a mask. Thus, n-type impurity layers 37 are formed in the silicon substrate 21 of the NMIS region. The resist pattern 35 is removed.

Figure 5C:
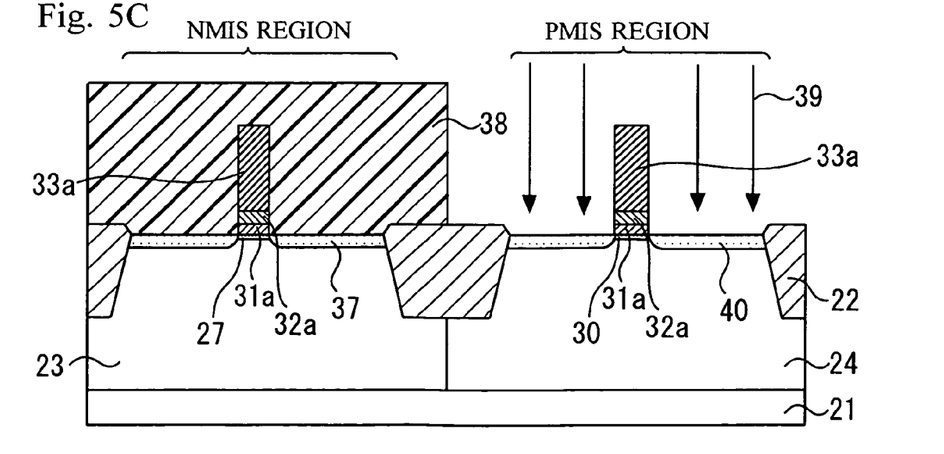

Next, as shown in FIG. 5C, a resist pattern 38 covering the NMIS region is formed using a lithography technique. Boron ions 39 as p-type impurities for forming p-type extension regions are implanted with an acceleration voltage of 0.2 kev and with a dosage of, for example, $1\times10^{15}$ atoms/cm$^2$ using the gate electrode 33a of the PMIS region as a mask. Thus, a p-type impurity layer 40 is formed on the silicon substrate 21 of the PMIS region.

Thereafter, a heat treatment is performed. Thus, as shown in FIG. 6A, the arsenic ions in the n-type impurity layer 37 of the NMIS region are activated to form n-type extension regions 37a, and the boron ions in the p-type impurity layer 40 of the PMIS region are activated to form p-type extension regions 40a.

Figure 6A:
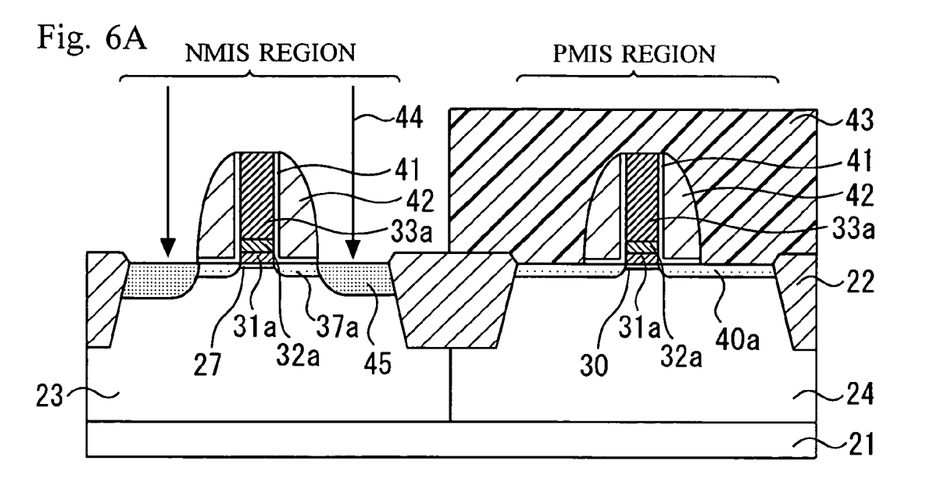

Next, as shown in FIG. 6A, a silicon oxide film 41 is formed on the entire surface of the substrate 21 in a film thickness of, for example, 2 nm. A silicon nitride film 42 is formed on the silicon oxide film 41 in a film thickness of, for example, 50 nm to 80 nm. Subsequently, the silicon nitride film 42 and the silicon oxide film 41 are anisotropically etched. Thus, sidewall spacers 42 covering sides of the gate electrode 33a are formed in a self-aligning manner.

Next, a resist pattern 43 covering the PMIS region is formed using a lithography technique. Arsenic ions 44 as n-type impurities for forming n-type source/drain regions are implanted with an acceleration voltage of 35 keV and with a dosage of, for example, $5 \times 10^{15}$ atoms/cm$^2$ using the sidewall spacers 42 and the gate electrode 33a of the NMIS region as masks. Thus, n-type impurity layers 45 are formed in the upper layer of the silicon substrate 21 of the NMIS region. The resist pattern 43 is removed.

Figure 6B:
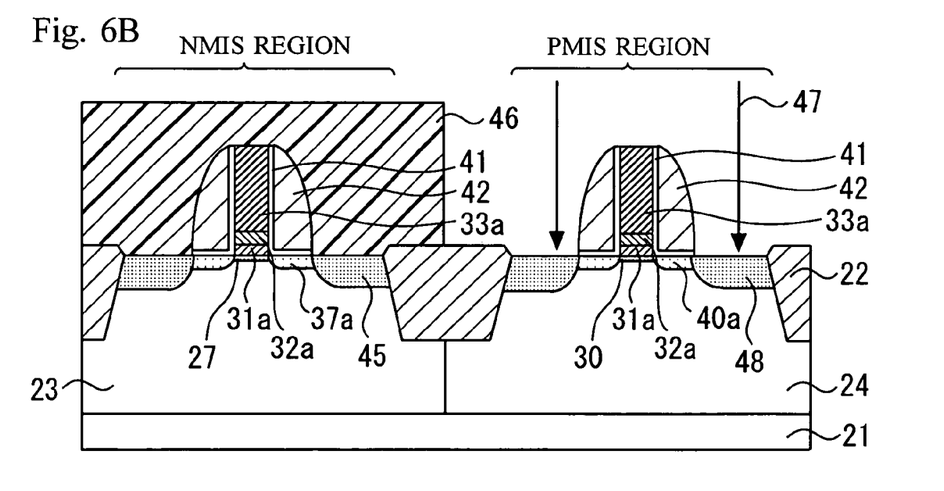

Next, as shown in FIG. 6B, a resist pattern 46 covering the NMIS region by a lithographic technique. Boron ions 47 asp-type impurities for forming the p-type source/drain regions are implanted with an acceleration voltage of 5 keV and with a dosage of, for example, $3 \times 10^{15}$ atoms/cm$^2$ using the sidewall spacers 42 and the gate electrode 33a of the PMIS region as masks. Thus, p-type impurity layers 48 are formed in the upper layer of the silicon substrate 21 of the PMIS region. The resist pattern 46 is removed.

Figure 6C:
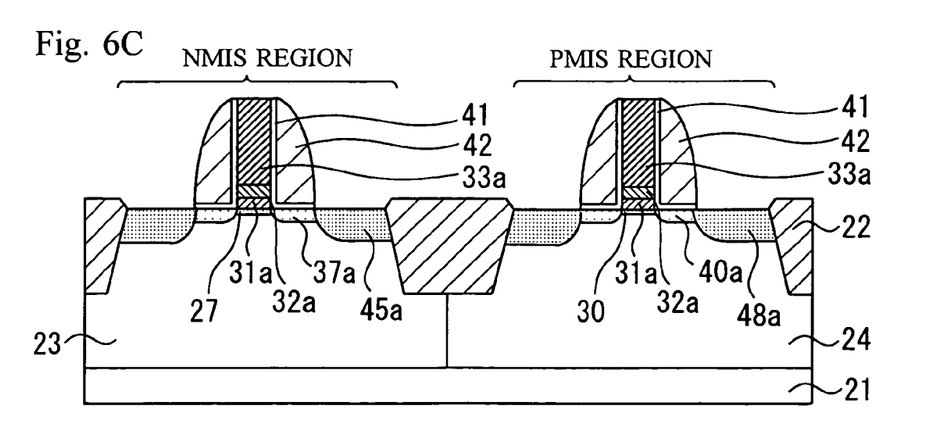

Lastly, as shown in FIG. 6C, a heat treatment is performed with a temperature of not less than 1,000° C. but not more than 1,050° C. for several minutes. Thus, the arsenic ions in the n-type impurity layers 45 of the NMIS region are activated to form-type source/drain regions 45a, and the boron ions in the p-type impurity layers 48 of the PMIS region are activated to form of source/drain regions 48a.

As described above, in this second preferred embodiment, after the formation of the p-well 23 in the NMIS region and the formation of the n-well 24 in the PMIS region, the arsenic ions 26 are implanted into the extreme surface layer of the channel portion of the p-well 23, and a heat treatment is performed. Thus, the p-type low-concentration layer 27 having a higher impurity concentration than the p-well 23 is formed. Further, the boron ions 29 are implanted into the extreme surface layer of the channel portion of the n-well 24, and a heat treatment is performed. Thus, the n-type low-concentration layer 30 having a lower impurity concentration than the n-well 24 is formed. As a result, even in a case where an HfAlOx film containing metals is used as a gate dielectric layer, it is possible to control the threshold voltage of the n-type channel MISFET and the p-type channel MISFET. Therefore, the threshold voltage of a complementary semiconductor device having a high-k gate dielectric layer can be controlled with high accuracy.

Figure 7:
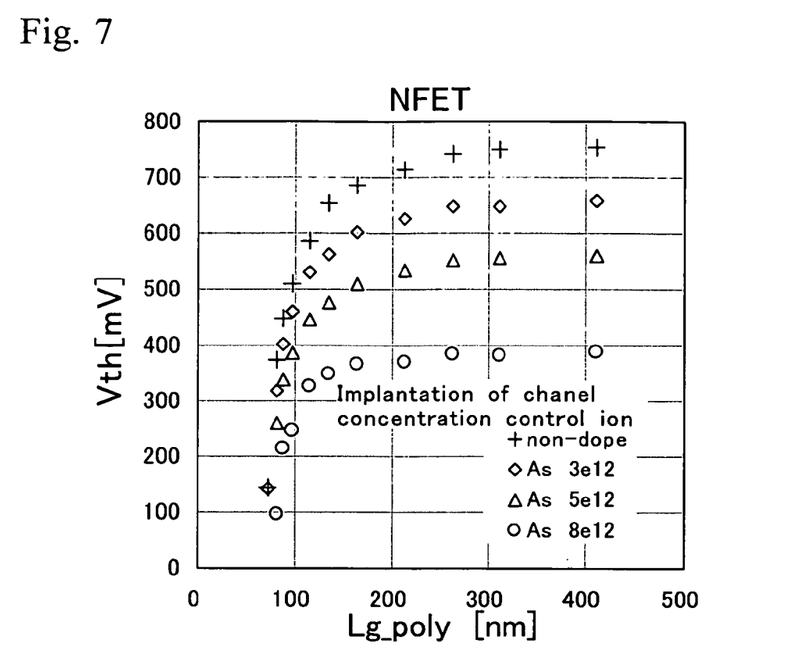
FIG. 7 is a diagram for showing a relationship between a threshold voltage and a gate length of a n-type channel MISFET according to various preferred embodiments of the present invention.

FIG. 7 is a diagram for showing a relationship between a threshold voltage and a gate length of a n-type channel MISFET according to a preferred embodiment of the present invention.

As shown in FIG. 7, an increase in the threshold voltage of a NMISFET is observed when ion implantation for impurity concentration control into a channel portion is not performed. The threshold voltage can be suppressed by performing ion implantation. In order to control the threshold voltage of a NMISFET to a preferred range of, specifically, 300 mV to 600 mV with a gate length of not less than 90 nm, which is a minimum value at the present stage, it is preferred that arsenic ions are implanted with a dosage of 5 to $8 \times 10^{12}$ atoms/cm$^2$. In this case, the p-well is formed by implanting boron ions with a dosage of $1 \times 10^{13}$ atoms/cm$^2$ and with an acceleration voltage of 130 keV.

Figure 8:
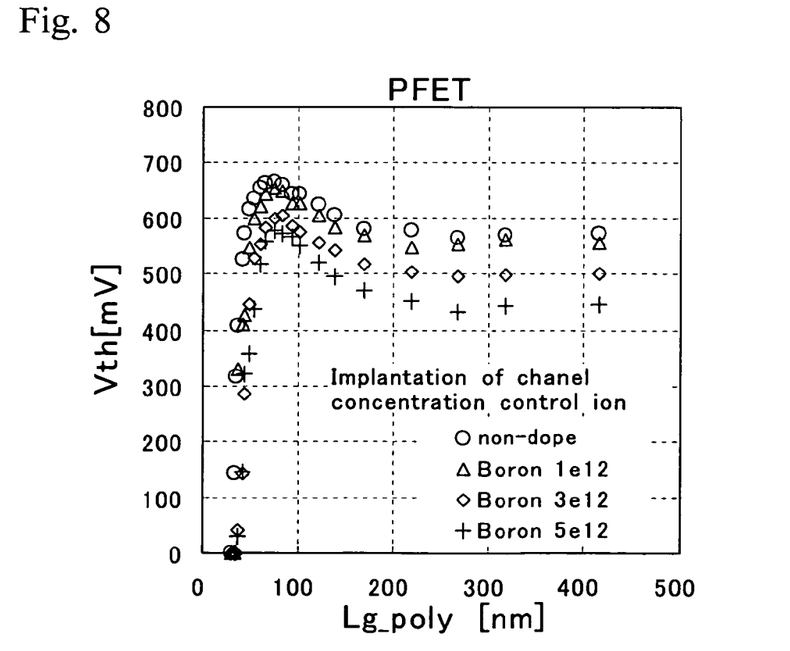
FIG. 8 is a diagram for showing a relationship between a threshold voltage and a gate length of a p-type channel MISFET according to various preferred embodiments of the present invention.

FIG. 8 is a diagram for showing a relationship between a threshold voltage and a gate length of a p-type channel MISFET according to a preferred embodiment of the present invention.

As shown in FIG. 8, as with the above-described NMISFET, an increase in the threshold voltage of a PMISFET is observed when ion implantation for impurity concentration control into a channel portion is not performed. The threshold voltage can be suppressed by performing ion implantation. In order to control the threshold voltage of a NFET to a preferred range of, specifically, 400 mV to 600 mV with a gate length of not less than 90 nm, which is a minimum value at the present stage, it is preferred that boron ions are implanted with a dosage of 3 to $5 \times 10^{12}$ atoms/cm$^2$. In this case, the n-well is formed by implanting phosphorus ions with a dosage of $1 \times 10^{13}$ atoms/cm$^2$ and with an acceleration voltage of 300 keV.

This invention, when practiced illustratively in the manner described above, provides the following major effects.

As described above, in various preferred embodiments of the present invention, by forming a low-concentration layer having a low impurity concentration in an extreme surface layer of a channel portion of a well region, it is possible to control the threshold voltage of a semiconductor device having a high-k gate dielectric layer with high accuracy.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A semiconductor device, comprising:
   a well of a first conductive type formed in an upper layer of a substrate;
   a low-concentration layer of the first conductive type having a lower impurity concentration than the well, the low-concentration layer being formed in an extreme surface layer of a channel portion of the well;
   a high-k gate dielectric layer having a higher dielectric constant than a silicon oxide film, the high-k gate dielectric layer being formed on the low-concentration layer;
   a gate electrode formed on the high-k gate dielectric layer;
   extension regions of a second conductive type formed in an upper layer of the well, the extension regions sandwiching the low-concentration layer; and
   source/drain regions of the second conductive type formed in an upper layer of the well, the source/drain regions sandwiching the low-concentration layer and the extension regions; wherein
   a depth of the low-concentration layer from an upper surface of the substrate is smaller than a death of the extension regions from the upper surface of the substrate.

2. The semiconductor device according to claim 1, wherein the depth of the low-concentration layer from the upper surface of the substrate is smaller than about 10 nm.

3. A complementary semiconductor device having a n-type circuit region and a p-type circuit region, comprising:
   a p-type well formed in an upper layer of a substrate of the n-type circuit region;
   a n-type well formed in an upper layer of the substrate of the p-type circuit region;
   a p-type low-concentration layer formed in an extreme surface layer of a channel portion of the p-type well, the p-type low-concentration layer having a lower impurity concentration than the p-type well;
   a n-type low-concentration layer formed in an extreme surface layer of a channel portion of the n-type well, the n-type low-concentration having a lower impurity concentration than the n-type well;
   a high-k gate dielectric layer formed on the p-type and n-type low-concentration layers, the high-k gate dielectric layer having a higher dielectric constant than a silicon oxide film;
   a gate electrode formed on the high-k gate dielectric layer;

n-type extension regions formed in an upper layer of the p-type well, the n-type extension regions sandwiching the p-type concentration layer;

n-type source/drain regions formed in an upper layer of the p-type well, the n-type source/drain regions sandwiching the p-type low-concentration layer and the n-type extension regions;

p-type extension regions formed in an upper of the n-type well, the p-type extension regions sandwiching the n-type low-concentration layer; and p-type source/drain regions formed in an upper layer of the n-type well, the p-type source/drain regions sandwiching the n-type low-concentration layer and the p-type extension regions; wherein a depth of the p-type low-concentration layer from an upper surface of the substrate is smaller than a depth of the n-type extension regions from the upper surface of the substrate; and a depth of the n-type low-concentration layer from the upper surface of the substrate is smaller than a depth of the p-type extension regions from the upper surface of the substrate.

4. The complementary semiconductor device according to claim 3, wherein the depth of the p-type low-concentration layer from the upper surface of the substrate is smaller than about 10 nm; and the depth of the n-type low-concentration layer from the upper surface of the substrate is smaller than about 10 nm.

* * * * *